United States Patent [19]
Park et al.

[11] Patent Number: 4,848,641
[45] Date of Patent: Jul. 18, 1989

[54] FLUX DISPENSER

[75] Inventors: Joon Park, Glendale; Han C. Leung, Los Angeles, both of Calif.

[73] Assignee: Hughes Aircraft Company, Los Angeles, Calif.

[21] Appl. No.: 215,186

[22] Filed: Jul. 5, 1988

[51] Int. Cl.⁴ .................. B23K 1/20; B23K 3/06
[52] U.S. Cl. ................... 228/37; 228/6.2; 228/47; 228/257; 228/260; 118/429
[58] Field of Search ........... 228/207, 233, 257, 260, 228/5.1, 33, 37, 40, 6.2, 47; 118/428, 429

[56] References Cited
U.S. PATENT DOCUMENTS

| | | | |
|---|---|---|---|
| 1,677,248 | 7/1928 | Reinbold | 228/37 |
| 4,011,980 | 3/1977 | Dvorak et al. | 228/37 |
| 4,151,945 | 5/1979 | Ragard et al. | 228/6.2 |
| 4,778,099 | 10/1988 | Dines | 228/207 |

Primary Examiner—Nicholas P. Godici
Assistant Examiner—Samuel M. Heinrich
Attorney, Agent, or Firm—Leonard A. Alkov; A. W. Karambelas

[57] ABSTRACT

Fluxing station (34) has a flux dispenser (52) where liquid flux cascades down steps (88, 90). Circulating pump (46) draws liquid flux from a reservoir (54) below the steps and recirculates it to cascade down the steps. There is provision to add makeup flux from reservoir (38) or supply a cleaning liquid such as alcohol from reservoir (37) to clean the circulating system. A drain (62) is provided. Electrical components can be positioned with their leads on the steps so that liquid flux cascades thereover for accurately fluxing only the ends of the leads. Two or more pairs of steps, with different spacing, may be provided to accommodate components of different lengths.

24 Claims, 3 Drawing Sheets

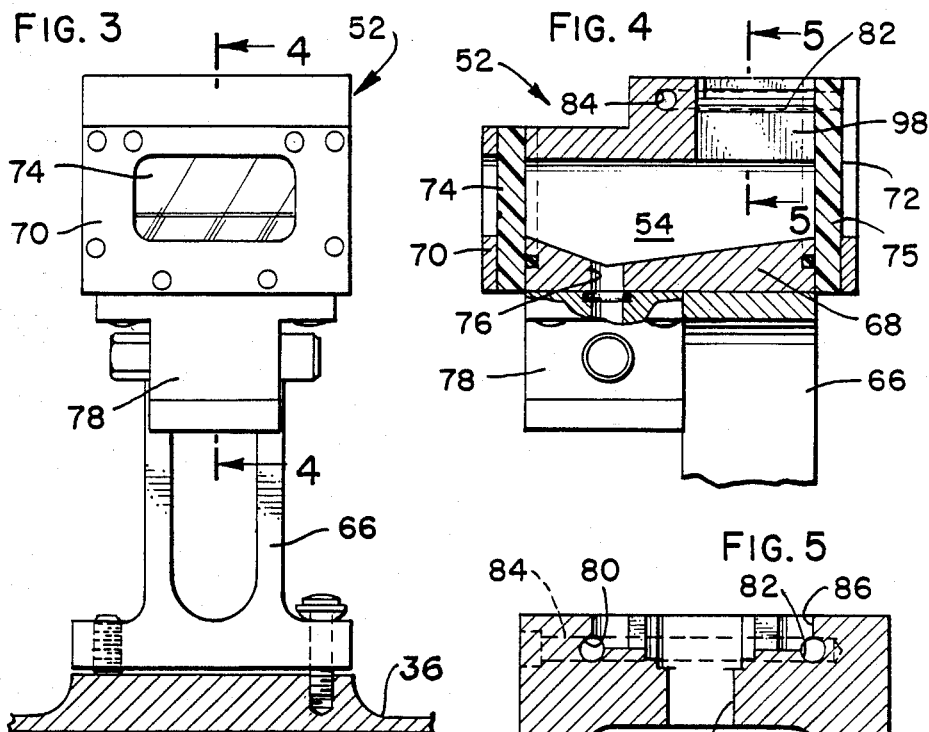
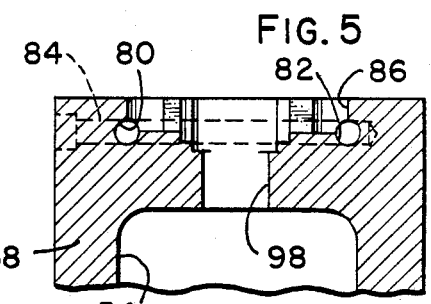
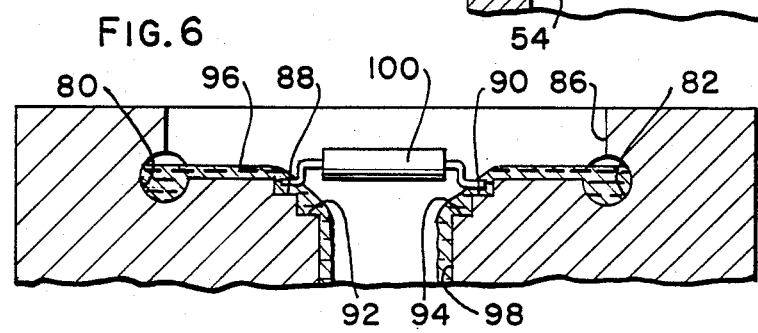
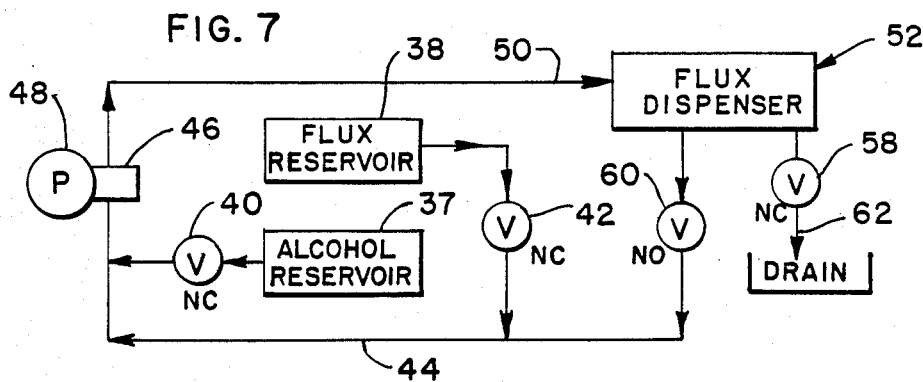

FLUX DISPENSER

FIELD OF THE INVENTION

This invention is directed to a dispenser which provides soldering flux in a position such that the leads of electrical components can be dipped into the flux between a component dispensing pickup station and the station where the component is placed for soldering.

BACKGROUND OF THE INVENTION

When electrical components are placed on printed circuit boards for attachment of the component leads to traces on the printed circuit board, the attachment is usually by reflow soldering. The leads and the solder surfaces must be wetted with flux in order to provide for reliable soldering. In previous automatic assembly systems, the surface of the printed circuit board, including the traces thereon, was wetted with flux. This wetting of the printed circuit board produced several problems. It is difficult for the pattern recognition system to identify pads on the circuit traces because of the light reflection from the flux coated surfaces, because both the traces and the printed circuit board dielectric surfaces were flux-coated. The coating of the entire printed circuit board also required that the whole solder pad be wetted. The flux penetrated between the pads and components. This resulted in a longer time to clean off the flux after all of the components were placed and soldered on the printed circuit board. In addition, it is difficult to automate the wetting of the printed circuit board with flux, for use in an automated assembly line. It is thus desirable to individually wet the component leads, rather than the entire printed circuit board.

Surface mounted electrical components on printed circuit board are more widely used. More industries are adopting the surface mount technology in which the leads of the electrical components are attached to the pads on a printed circuit board by lying on the pads, and reflow solder provides the attachment.

SUMMARY OF THE INVENTION

In order to aid in the understanding of this invention, it can be stated in essentially summary form that it is directed to a flux dispenser. The flux dispenser has fresh flux cascading down two paths, facing in each and spaced so that the opposite leads on an electrical component may be dipped in flux at the same time. The flux dispenser can be positioned for access by automatic assembly equipment wherein a part is picked up, fluxed and placed.

It is thus a purpose and advantage of this invention to provide a flux dispenser which provides fresh flux for fluxing of the leads of electrical components for automatic assembly.

It is another purpose and advantage of this invention to provide a flux dispenser wherein different parts of different lengths and having end leads thereon can be sequentially fluxed on the dispenser without adjustment.

It is further purpose and advantage of this invention to dip only the leads of the component into flux to control the amount of flux applied to the lead and to avoid flux wetting the body of the component.

It is another purpose and advantage of this invention to provide a flux dispenser which reliably provides proper flux to electrical components and has built-in self-cleaning capability so that old flux can be removed from the flux circulating path and the flux circulating path cleaned before fresh flux is reintroduced into the circulating path.

Other purposes and advantages of this invention will become apparent from a study of the following portion of this specification, the claims and the attached drawings.

BRIEF DESCRIPTION OF THE DRAWINGS

FIG. 3 is an end view of the dispenser, with a section taken through the base, as seen generally along the line 3—3 of FIG. 2, and enlarged with respect thereto.

FIG. 4 is a section through the flux dispenser, as seen generally along line 5—5 of FIG. 4.

FIG. 6 is an enlarged section through the flux dispenser showing a part having its leads fluxed.

FIG. 7 is a schematic flow diagram showing the flux and cleaning fluid flow between the various parts of the flux dispenser.

DESCRIPTION OF THE PREFERRED EMBODIMENT

Figure 1:
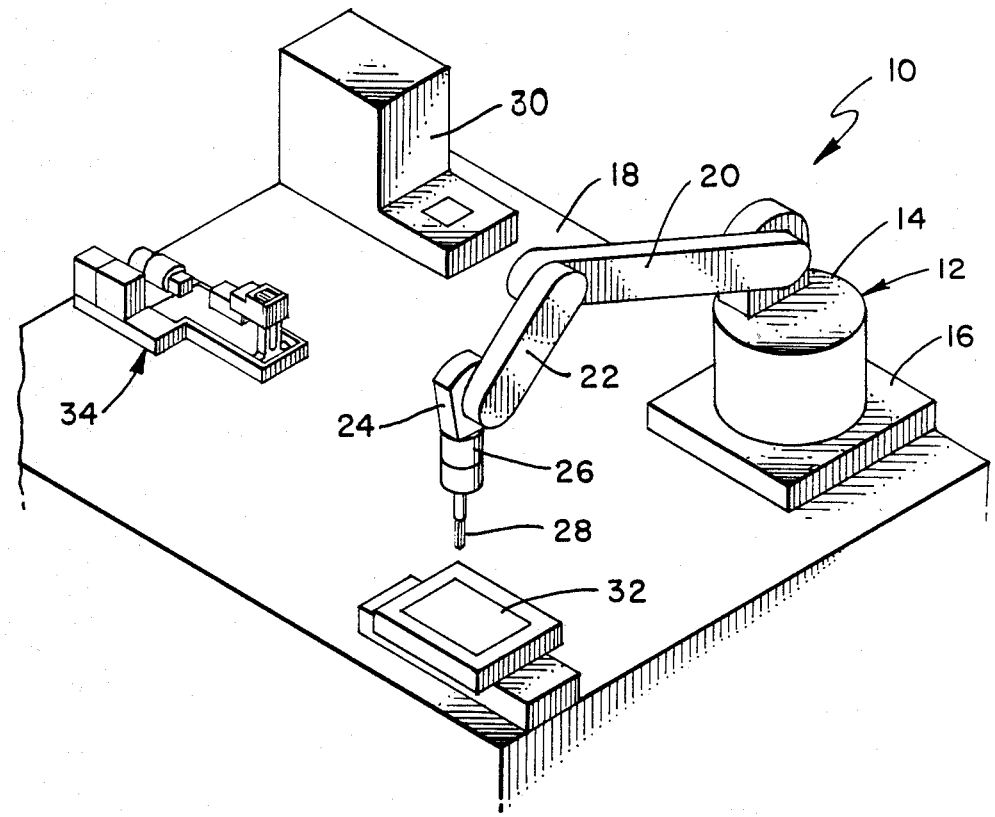
FIG. 1 is an isometric view of an automatic assembly device including the flux dispenser of this invention.

In FIG. 1, an assembly station is generally indicated at 10. The assembly station has a programmable positioning device which may be called a robot. The robot device is generally indicated at 12. The robot has a stand 14 which is rotatable upon a vertical axis on its base 16, which is in turn secured on the table 18 of the assembly station 10. Stand 14 has arms 20, 22 and 24 successively pivoted to each other. Arm 24 has mounting plate 26 on its end. The face of the mounting plate 26 is the face upon which the pickup device 28 is mounted. The pickup device has fingers suitable for picking up the component, for example, by its lead. It can be seen that the robot can position the pickup device anywhere in X, Y and Z coordinates, using the top of the assembly station as a reference. In addition, the mounting plate 26 rotates around an axis, which is the Z-axis when positioned as shown in FIG. 1. The rotational axis of the mounting plate 26 can be angularly moved with respect to the Z-axis. Each of the arm pivots and rotational pivots is powered and feedback signaling of position is available so that the mounting plate can be moved into any desired position. For automated assembly, these position signals are provided by computer control.

Dispensing station 30 is positioned on the assembly station. The dispensing station dispenses electronic components which can be picked up by the pickup device 28 and moved to a selected position. The components dispensed at station 30, for example, are cylindrical components with an electric wire lead extending from each end thereof. The leads are bent in zee shape so that the leads can lie against a surface while the larger diameter of the body of the electrical component lies against or is spaced from the surface. It is to be noted that such electrical components have different lengths.

Printed wiring board 32 is the location on which the electrical devices will be placed, with the leads against the printed wiring board for soldering at a particular location with respect thereto. Thus, electrical devices are picked up by the pickup device 28 at the dispensing station 30 and these electrical devices are carried to the printed wiring board 32 and held thereon while they are attached thereto. Attachment is made by reflow soldering when solder heater bars are held onto the leads where they lie against the printed wiring board.

Figure 2:
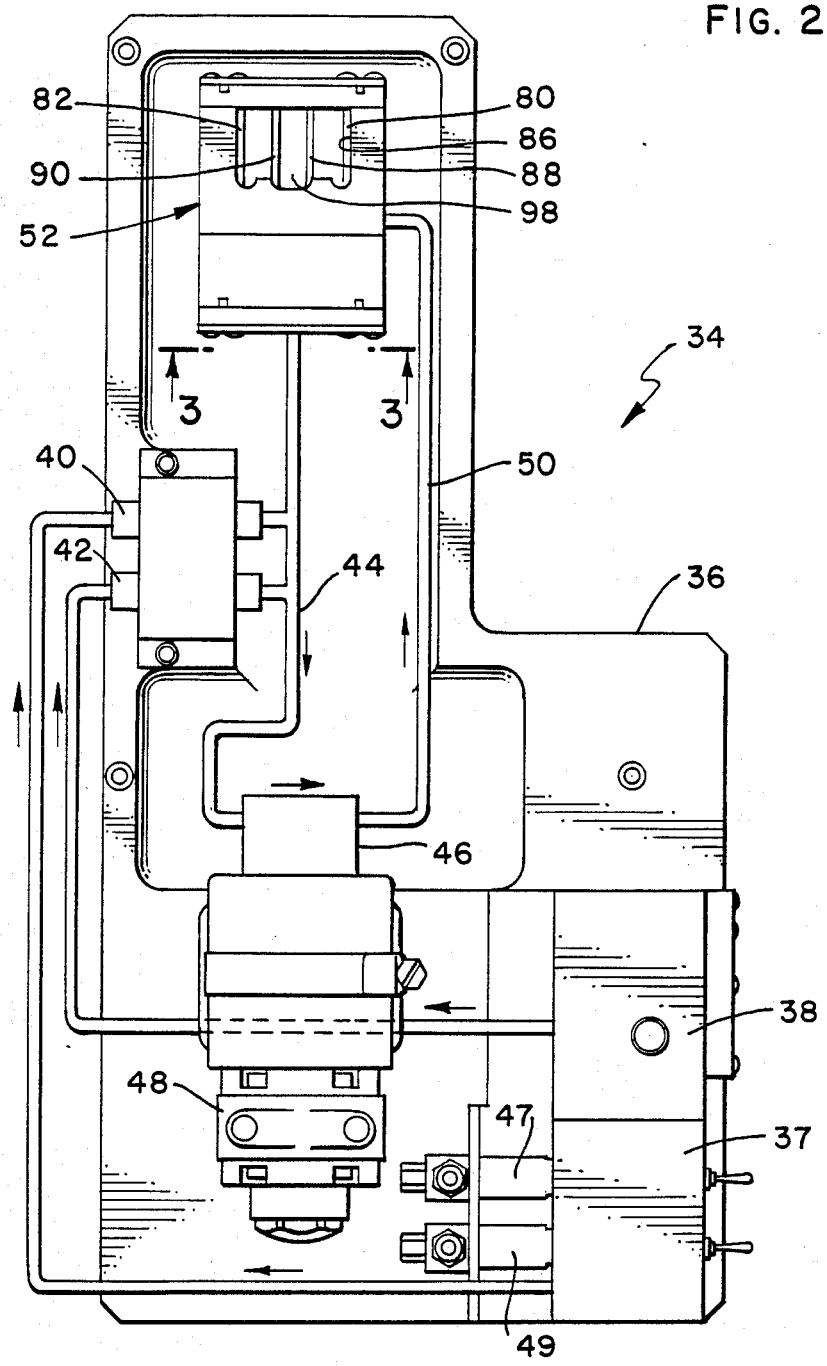
FIG. 2 is a plan view of the flux dispenser of this invention.

For proper reflow solder attachment, the electrical devices must be fluxed. Fluxing station 34 is provided on the assembly station so that electrical devices can be picked up, fluxed at the fluxing station 34, placed on the printed circuit board, and attached to pads on the board by soldering. FIG. 2 shows the fluxing station 34 in plan view, on base 36 which is secured to the table 18. Alcohol reservoir 37 and flux makeup reservoir 38 are mounted on the base. Valves 40 and 42 are normally closed valves which respectively connect the alcohol reservoir and the flux reservoir to the circulating pump suction line 44. Flux pump 46 is powered by air motor 48 to discharge fluid through flux line 50 to flux dispenser 52. Air valves 47 and 49 are connected in parallel from a source of air under pressure, and each has a series orifice so that opening either valve drives the motor at a selected speed.

As is best seen in FIG. 4, flux dispenser 52 has an internal reservoir 54 therein for circulating flux. The bottom of the circulating flux reservoir 54 is connected by line 56 to valves 58 and 60, which are shown as separate valves in FIG. 7 and which are in valve block 78 in FIG. 4. Valve 58 is normally closed and discharges to drain 62 when opened. Valve 60 is normally open and is connected to the pump suction line 44.

The pump normally pumps flux from the circulating flux reservoir 54 in the bottom of flux dispenser 52 back into the top of the flux dispenser. When more flux is required, valve 42 is opened to add makeup flux supply. When it is desired to clean the system, for example when the flux gets too thick or at the end of a production run, valve 60 is closed, valve 62 is opened, and valve 40 is opened. This provides for the flow of a cleaning solution, such as alcohol, through the pump and flux dispenser to drain. When it is desired that the system be started up again to circulate flux, the alcohol valve 40 and drain valve 58 are closed, valve 60 is opened to permit circulation through the system, and valve 42 is opened to add flux until the flux level in reservoir 54 is as desired.

The structure of the flux dispenser itself is shown in detail in FIGS. 3, 4, 5 and 6. Stand 66 holds the body 68 above the base 36. Body 68 is open at each end and carries covers 70 and 72 respectively at its front and rear ends. Cover 70 has a transparent window 74 therein and cover 72 has transparent window 75 to view the level of flux within flux reservoir 54. The flux reservoir 54 is formed as an open interior with downwardly sloping bottom. The bottom has a drain opening 76 therein which opens to valve block 78 thereon to permit the gravitational discharge of liquid in the reservoir 54 to return line 44.

Above reservoir 54 two longitudinal channels 80 and 82 are formed as innerdrillings near the top of body 68. The longitudinal channels are connected to cross innerdrilled channel 84, which is connected to receive liquid from supply line 50. Recess 86, seen best in FIG. 6, is a milled slot cut down to the channels 80 and 82. The width of the recess 86 is equal to the center line spacing of the channels, and, in depth, the recess goes down to the center line of the channels. This opens up one upper quadrant of the channels. Interiorly of recess 86, further milled recesses, successively deeper and narrower, create the wider pair of steps 88 and 90 and deeper and narrower pair of steps 92 and 94. As seen in FIG. 6, when flowing, the flux 96 flows down the steps to provide flux filled steps. Two pairs of steps are shown, a pair of greater width and a pair of lesser width. Drain slot 98 opens from the lowest step down into the reservoir 54, see FIGS. 4 and 5. When the flux pump is running, flux cascades down the steps.

Electronic component part 100 has a cylindrical body and has axial leads therefrom, as seen in FIG. 6. This structure resembles a resistor. The axial leads are bent in Z-shape so that each has a foot which lies below the body. Other body shapes may be employed and other types of electrical components. Some may have plural leads on the ends, such as a flat pack with a pair of lead frames. The fingers 28 on the robot pick up the component 100, flux it by dipping its leads into the flowing flux, as shown in FIG. 6, and carry the fluxed part to its location on the printed wiring circuit board wherein it is soldered in position. The two pairs of steps, with different spacing therebetween, permit the fluxing of parts having different lengths. It is clear that one pair or more than two pairs of steps can be provided, and the numbers of pairs and the spacing therebetween is a function of the lengths of different electrical components which will be fluxed.

Instead of fixed steps, dispenser body can be structured so that the spacing between the steps is mechanically adjustable. A motor can be connected to the steps of adjustable spacing, together with space sensing, so that the spacing can be program controlled. Cleaning of the flux dispenser at the completion of a run is easily accomplished by draining the flux, circulating alcohol, and then draining the alcohol. The flux dispenser can be employed in the fluxing of a large number of parts which are automatically handled during automatic assembly operations, with only routine observation. The transparent observation windows 74 and 75 permit inspection of reservoir level and inspection of flux flow.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A flux dispenser comprising:
    a body;
    a pair of steps facing each other;
    means for supplying and flooding fluid flux down said steps so that an electrical component can be placed with its leads adjacent said steps so that flux cascades over the leads; and
    means for collecting the flux cascading down the steps.

2. The flux dispenser of claim 1 further including means for recirculating flux to said means for supplying fluid flux.

3. The flux dispenser of claim 2 wherein said means for collecting and recirculating includes a reservoir below said steps and a pump taking suction from said reservoir and delivering fluid flux to said means for supplying fluid flux.

4. The flux dispenser of claim 3 further including a makeup reservoir for adding fluid flux when said reservoir receiving fluid flux from said steps has insufficient fluid flux therein.

5. The flux dispenser of claim 4 further including a cleaning liquid reservoir, said cleaning liquid reservoir being connected to the suction of said pump so that cleaning liquid can be circulated through said pump, down said steps and into said flux dispenser for cleaning thereof.

6. The flux dispenser of claim 5 further including a drain connected to said flux reservoir for draining flux therein and for draining cleaning liquid therefrom.

7. The flux dispenser of claim 1 wherein said steps are mechanically adjustable toward and away from each other.

8. The flux dispenser of claim 1 wherein there are first and second pairs of facing steps, said first pair of facing steps being spaced farther from each other than said second pair of facing steps so that electrical components having different lead lengths can be separately fluxed thereon without adjustment of said flux dispenser.

9. The flux dispenser of claim 8 wherein said means for supplying is a flux circulating pump connected to said flux reservoir for drawing liquid flux from said flux reservoir and discharging it to said liquid flux supply means.

10. The flux dispenser of claim 9 wherein a flux makeup reservoir is connected to supply makeup liquid flux to maintain flux level in said flux reservoir.

11. The flux dispenser of claim 9 wherein a cleaning liquid reservoir is connected to supply cleaning liquid for circulation through said pump, down said steps and into said flux reservoir for cleaning thereof.

12. A flux dispenser comprising:
a body;
recesses in said body to form a pair of steps, an opening between said steps to drain liquid flux away from said steps, a reservoir below said steps;
a pump connected to said reservoir to pump liquid flux from said reservoir and deliver liquid flux to said steps so that liquid flux cascades down said steps so that an electrical component having a lead spacing no greater than the spacing between said steps can have its leads inserted into flowing liquid flux cascading down said steps to flux the leads.

13. The flux dispenser of claim 12 wherein said liquid flux reservoir is within said body directly below said opening.

14. The flux dispenser of claim 12 wherein first and second longitudinal channels are positioned in said block adjacent said steps, said pump supplying liquid flux to said channels so that liquid flux from said channels flows down said steps.

15. The flux dispenser of claim 14 wherein said liquid flux channels are substantially parallel to said steps and are at substantially the same height of said steps.

16. The flux dispenser of claim 15 wherein said liquid flux reservoir is within said body directly below said opening.

17. The flux dispenser of claim 12 further including a makeup flux reservoir connected to supply makeup liquid flux to maintain liquid flux level in said flux reservoir.

18. The flux dispenser of claim 17 wherein said makeup flux reservoir is connected to the suction of said pump for supplying makeup flux.

19. The flux dispenser of claim 12 wherein a liquid cleaner reservoir is connected to the suction of said pump so that liquid cleaner can be circulated through said pump, down said steps and into said reservoir for cleaning liquid flux therefrom.

20. The flux dispenser of claim 19 further including a makeup flux reservoir connected to supply makeup liquid flux to maintain liquid flux level in said flux reservoir.

21. The flux dispenser of claim 20 wherein said makeup flux reservoir is connected to the suction of said pump for supplying makeup flux.

22. The flux dispenser of claim 12 wherein said steps are mechanically adjustable toward and away from each other.

23. The flux dispenser of claim 12 wherein there are recesses in said body to form two pairs of facing steps at different distances from each other to flux components of different lengths.

24. The flux dispenser of claim 12 wherein said flux dispenser is configured for connection as part of an automatic assembly machine which includes an electrical component dispensing station, a printed wiring board station and a controlled set of pickup fingers which pick up an electrical component at the dispensing station, carry it to said flux dispenser wherein flux flows over the leads of the component and places the component on a printed wiring board at said printed wiring board station.

* * * * *